(12) United States Patent
Potlapalli et al.

(10) Patent No.: US 6,798,371 B1
(45) Date of Patent: Sep. 28, 2004

(54) TECHNIQUES FOR CONTEXT-BASED ANALOG-TO-DIGITAL SIGNAL CONVERSION

(75) Inventors: Yasho Potlapalli, Cary, NC (US); Octavian Beldiman, Durham, NC (US); Takashi Fujita, Hyogo (JP); Arlon Wilber, Durham, NC (US)

(73) Assignee: Renesas Technology America, Inc., San Jose, CA (US)

( * ) Notice: Subject to any disclaimer, the term of this patent is extended or adjusted under 35 U.S.C. 154(b) by 0 days.

(21) Appl. No.: 10/628,916

(22) Filed: Jul. 29, 2003

(51) Int. Cl.[7] .............................................. H03M 1/12
(52) U.S. Cl. ...................................................... 341/155
(58) Field of Search ................................ 341/155, 141, 341/162, 160; 710/65, 69

(56) References Cited

U.S. PATENT DOCUMENTS

| | | | |
|---|---|---|---|
| 5,291,197 A | 3/1994 | Abe | 341/141 |
| 5,302,952 A | 4/1994 | Campbell, Jr. et al. | 341/155 |
| 5,736,949 A * | 4/1998 | Ong et al. | 341/141 |
| 5,760,611 A * | 6/1998 | Gould | 326/113 |
| 6,075,368 A * | 6/2000 | Schumacher et al. | 324/539 |
| 6,310,571 B1 * | 10/2001 | Yang et al. | 341/155 |
| 6,674,386 B2 * | 1/2004 | Carreau et al. | 341/155 |

* cited by examiner

*Primary Examiner*—Peguy JeanPierre
(74) *Attorney, Agent, or Firm*—Burns, Doane, Swecker & Mathis, LLP

(57) ABSTRACT

Techniques are described for analog-to-digital signal conversion. According to exemplary embodiments, a first request is associated with a changeable set of a plurality of input terminals, a second request is associated with a changeable one of the input terminals, and a third request is associated with a fixed one of the input terminals. One of the first, second, and third requests is received, and an analog signal presented at one of the input terminals is converted into a digital value based on the received one of the first, second, and third requests. When one of the second and third requests is received while converting a plurality of analog signals presented at the changeable set of the input terminals, a determination can be made whether the changeable set of the input terminals includes the one of the changeable and fixed input terminals associated with the received request.

24 Claims, 5 Drawing Sheets

TECHNIQUES FOR CONTEXT-BASED ANALOG-TO-DIGITAL SIGNAL CONVERSION

BACKGROUND

Microcontroller units (or MCUs) can be used in wide variety of applications to control the operation of complex systems. For example, an MCU can be used in an automotive environment to control the operation of vehicle subsystems, such as an inflatable restraint system or a climate control system. When used in such environments, the MCU can be required to monitor the operation of system components by measuring (or sampling) signals used or produced by the components. Often these signals can be analog signals, which are generally defined as signals that are time-varying and continuous.

The analog signals can be sampled and the samples converted to digital values (logical "ones" and "zeroes") using an analog-to-digital (A/D) converter. The A/D converter can be included on an integrated circuit (IC) chip along with the MCU, and the digital values produced by the A/D converter can be used by the MCU to monitor and control the operation of the components. The number of analog signals that can be required to be converted into digital values to monitor and control the operation of a complex system can be great. An MCU IC chip can include a large number of input pins (or terminals) to receive the analog signals.

A single "on-chip" A/D converter can be used to sample the analog signals presented at several of the input terminals. A control signal, often referred to as a "trigger", can be used to initiate a conversion. The A/D converter can be configured to operate in a particular manner (or mode) prior to the occurrence of a triggering event. For example, the A/D converter can be configured prior to the occurrence of multiple triggering events to sequentially convert the analog signals presented at several of the input terminals (referred to here as a "sweep" mode). The A/D converter can also be configured to convert the analog signal presented at only one of the input terminals (referred to here as a "one-shot" mode), such that the later occurrence of multiple triggering events can result in the repeated conversion of the analog signal presented at the one input terminal.

With such arrangements, software (or firmware) can be used prior to the occurrence of a triggering event to configure the A/D converter in either the sweep or one-shot mode and to define the corresponding several or one input terminals presenting the analog signal(s) for conversion. U.S. Pat. No. 5,291,197 to Abe describes a one-chip data processor with built-in A/D converter for automatically repeating A/D conversions without instructions from a central processing unit (CPU). U.S. Pat. No. 5,302,952 to Campbell, Jr., et al. describes an A/D conversion module and method to minimize software involvement by providing a pause capacity.

SUMMARY

Techniques are disclosed for analog-to-digital signal conversion. According to an exemplary embodiment, a first request is associated with a changeable set of a plurality of input terminals, a second request is associated with a changeable one of the input terminals, and a third request is associated with a fixed one of the input terminals. One of the first, second, and third requests is received, and an analog signal presented at one of the input terminals is converted into a digital value based on the received one of the first, second, and third requests.

BRIEF DESCRIPTION OF THE DRAWINGS

The accompanying drawings provide visual representations which will be used to more fully describe the representative embodiments disclosed here and can be used by those skilled in the art to better understand them and their inherent advantages. In these drawings, like reference numerals identify corresponding elements, and.

DETAILED DESCRIPTION

Various aspects will now be described in connection with exemplary embodiments, including certain aspects described in terms of sequences of actions that can be performed by elements of a computer system. For example, it will be recognized that in each of the embodiments, the various actions can be performed by specialized circuits or circuitry (e.g., discrete and/or integrated logic gates interconnected to perform a specialized function), by program instructions being executed by one or more processors, or by a combination of both. The various aspects can thus be embodied in many different forms, and all such forms are contemplated to be within the scope of what is described. For each of the various aspects, any such form of embodiment can be referred to here as "logic configured to" perform, or "logic that" performs a described action.

Figure 1:
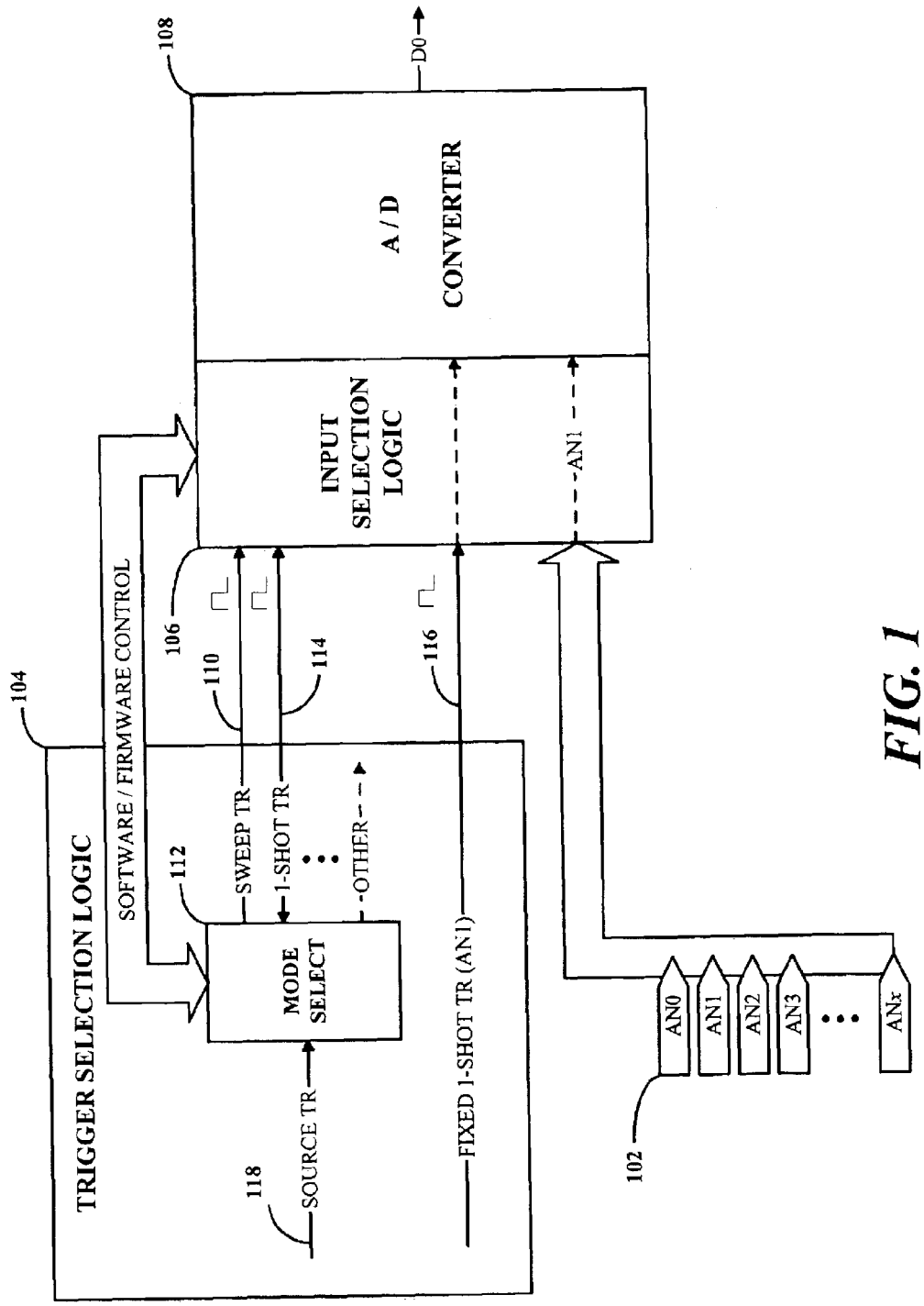
FIG. 1 illustrates a system for analog-to-digital signal conversion according to an exemplary embodiment.

An exemplary system for analog-to-digital signal conversion is shown in FIG. 1. The system includes a plurality of input terminals. For example, FIG. 1 shows a plurality of in put terminals 102 labeled AN0 through ANx coupled to a data bus. Each of the input terminals 102 can he configured to receive a corresponding analog signal for conversion into a digital value D0 by an A/D converter 108. The input terminals 102 can be the input pins of an MCU IC chip (not shown) that includes the A/D converter 108.

The system also includes logic configured to associate a first request with a changeable set of the input terminals. For example, the system can include trigger selection logic 104 that can be included on an MCU IC chip along with the A/D converter 108. As used here, a "request" can be a trigger signal used by the A/D converter 108 to initiate a conversion of an analog signal presented at one of the input terminals 102 into the digital value D0. Different requests (or trigger signals) can be generated from at least one trigger source 118 using mode select logic 112. The at least one trigger source 118 can be a signal generated using software (e.g., using a timer) or can be generated by hardware or logic that can be included either on or external to the MCU IC chip. Software or firmware can be used to define the request generated from the at least one trigger source 118. For example, the mode select logic 118 can be configured using software or firmware to generate the first request corresponding to a sweep trigger for operating the A/D converter 108 in a sweep mode as described above.

In the exemplary system, the first request is associated with a changeable set of the input terminals. For example, the changeable set can include any two or more of the input terminals 102, e.g., AN0–AN3, and can include all of the input terminals 102. As used here, "changeable" means that the number and/or sequence of the input terminals 102 that form the changeable set can be redefined before an occurrence of the first request.

For example, consider the task of performing a sequential conversion (or a sweep) of the analog signals presented at a set of four input terminals AN0–AN3. Prior to the occurrence of a sweep trigger on the signal line 110, software or firmware can be used to configure the input selection logic 106 coupled to the A/D converter 108 to define a starting input terminal 102 for the sweep, e.g., AN0, and a number of sequential input terminals 102 included in the sweep, e.g., four. Software or firmware can be used to reconfigure the input selection logic 106 to convert the analog signals presented at a different set of the input terminals 102 prior to a next occurrence of the sweep trigger.

The system also includes logic configured to associate a second request with a changeable one of the input terminals. For example, the mode select logic 118 can be configured using software or firmware to generate the second request from the at least one trigger source 118. The second request can correspond to a one-shot trigger for operating the A/D converter 108 in a one-shot mode as described above. The one of the input terminals associated with the second request is changeable in that the one of the input terminals 102 associated with the second request can be redefined before an occurrence of the second request.

For example, consider the task of performing a single conversion (or one-shot) of the analog signal presented at one of the input terminals AN3. Prior to the occurrence of a one-shot trigger on the signal line 114, software or firmware can be used to configure the input selection logic 106 coupled to the A/D converter 108 to define the single input terminal 102 associated with the one-shot conversion, e.g., AN3. Software or firmware can be used to reconfigure the input selection logic 106 to convert the analog signal presented at a different one of the input terminals 102 prior to a next occurrence of the one-shot trigger.

The system also includes logic configured to associate a third request with a fixed one of the input terminals. Like the second request, the third request is associated with a single input terminal 102, and can correspond to a one-shot trigger for operating the A/D converter 108 in a one-shot mode as described above. But unlike the input terminal associated with the second request, the one of the input terminals associated with third request is fixed. As used here, "fixed" means that the one input terminal associated with the third request cannot be redefined before an occurrence of the third request in the same manner as the changeable set and changeable one of the input terminals associated with the first and second requests, respectively, can be redefined.

For example, FIG. 1 shows a one-shot trigger signal generated by the trigger selection logic 104 carried over the signal line 116. The one-shot trigger signal is associated with a fixed one of the input terminals 102, e.g., AN1. The dashed lines in the figure indicate that the fixed one of the input terminals AN1 cannot be redefined in the same manner as can the changeable one input terminal associated with the second request, e.g., using software or firmrware in conjunction with the input selection logic 106. As a result, the total time associated with converting an analog signal presented at the fixed one of the input terminals can be less than the total time associated with converting an analog'signal presented at the changeable one of the input terminals. The reduction in conversion time can result from eliminating the need to specify the input terminal prior to performing the conversion. While the fixed one of the input terminals cannot be redefined in the same manner as can the changeable one input terminal associated with the second request, it should be understood that any one of the input terminals 102 can be associated with the third request, e.g., through appropriate hardware configuration.

The system also includes logic configured to receive one of the first, second, and third requests. For example, the logic can be the input selection logic 106 and/or the A/D converter 108. The received request can be carried to the input selection logic 106 and/or the A/D converter 108 over separate signal lines 110, 114, 116 dedicated to each of the first, second, and third requests. Accordingly, at any given time, the A/D converter 108 can be simultaneously armed at any given time to receive any of the first, second, and third requests.

The system also includes a converter coupled to the input terminals and the logic configured to associate and receive. The converter is configured to convert an analog signal presented at one of the input terminals into a digital value based on a received one of the first, second, and third requests. For example, in FIG. 1 the A/D converter 108 is coupled to the input terminals 102 and to the trigger selection and input selection logic 104, 106. In response to a first request, the A/D converter 108 can convert a group of analog signals, or portions (or samples) thereof, presented at a changeable set of the input terminals 102 into respective digital values D0. In response to a second request, the A/D converter 108 can convert an analog signal presented at a changeable one of the input terminals 102. And in response to a third request, the A/D converter 108 can convert an analog signal presented at a fixed one, e.g., AN1, of the input terminals 102. The A/D converter 108 can be of any suitable design, the specific details of which are well known to those skilled in the art and are beyond the scope of this disclosure.

Figure 2:
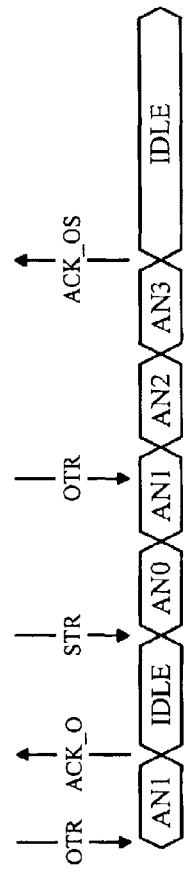
FIG. 2 illustrates exemplary timing diagrams associated with the conversion of signals using the system of FIG. 1.
Figure 2:
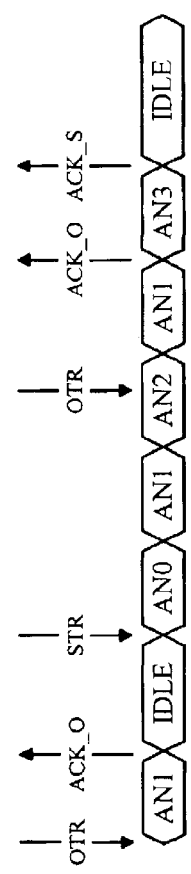
Figure 2:
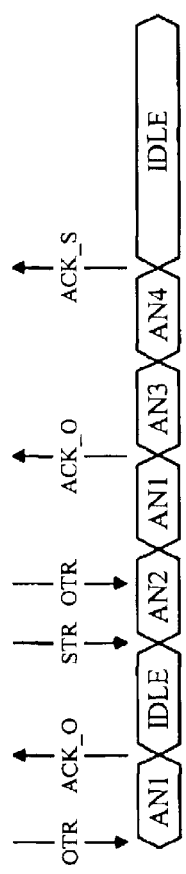
Figure 2:
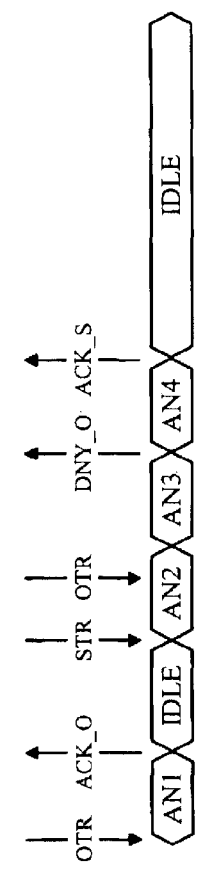

According to an exemplary embodiment, when one of the second and third requests is received while converting a plurality of analog signals presented at the changeable set of the input terminals, the system can include logic configured to determine whether the changeable set of the input terminals includes the one of the changeable and fixed input terminals associated with the received request. The logic can be included on an MCU IC chip along with A/D converter 108. For example, FIG. 2 shows four timing diagrams in which a one-shot trigger (OTR) for converting an analog signal presented at an input terminal occurs while the analog signals presented at a set of input terminals associated with a prior-occurring sweep trigger (STR) are being converted. The OTR can be associated with either a changeable or fixed one of the input terminals 102. The STR is associated with a changeable set of the input terminals 102.

In a related embodiment, when the changeable set of the input terminals includes the one of the changeable and fixed input terminals associated with the received request, the system can also include logic configured to acknowledge a completion of the received request when the converting of the plurality of analog signals is complete. For example, in the first and second timing diagrams shown in FIG. 2, the changeable set AN0–AN3 of the input terminals 102 associated with the STR includes the one input terminal AN1 associated with the OTR. In the first timing diagram, because the analog signal presented at the one input terminal AN1 will be converted during the sweep of the changeable set AN0–AN3 of the input terminals, an acknowledgement ACK_OS of the successful completion of both the one-shot of AN1 and the sweep of AN0–AN3 can be made at the end of the sweep. This operation is also depicted in blocks 408, 410, 414, and 412 of the flowchart shown in FIG. 4.

The system can also include logic configured to determine a priority between the converting of the plurality of analog signals and the received request. When the converting of the plurality of analog signals has the priority, the system can include logic configured to acknowledge a completion of the received request when the converting of the plurality of analog signals is complete. For example, in the first timing diagram shown in FIG. 2, the converting of the changeable set AN0–AN3 of the input terminals resulting from the earlier occurring STR has priority when the OTR occurs. As with the case of having no priority described above, because the analog signal presented at the one input terminal AN1 will be converted during the sweep of the changeable set AN0–AN3 of the input terminals, an acknowledgement ACK_OS of the successful completion of both the one-shot of AN1 and the sweep of AN0–AN3 can be made at the end of the sweep.

When the received request has the priority, the system can include logic configured to halt the converting of the plurality of analog signals, logic configured to convert the analog signal presented at the one of the changeable and fixed input terminals associated with the received request, and logic configured to resume the converting of the plurality of analog signals. For example, in the second timing diagram shown in FIG. 2, the OTR for AN1 occurs while the analog signals presented at the changeable set AN0–AN3 of the input terminals are being converted. Because in the example the OTR has priority over the current sweep, the sweep can be halted after completing the current conversion of the analog signal presented at AN2, and the analog signal presented at the one input terminal AN1 associated with the OTR can be converted. Successful completion of the one-shot conversion of AN1 can be acknowledged ACK_O, and the sweep can then be resumed. When the conversion of the analog signal presented at the last input terminal AN3 in the changeable set is complete, successful completion of the sweep can be acknowledged ACK_S.

When the received request has the priority, additional logic can be configured to determine whether the conversion of the analog signal presented at the one input terminal, e.g., AN1, has already occurred at the time the OTR is received. If the conversion has not already occurred, it can be unnecessary to halt the converting of the plurality of analog-signals, as the analog signal presented at the one input terminal, e.g., AN1, can be converted by completing the sweep of the changeable set of input terminals, e.g., AN0–AN3. This and other complex timing issues can make it preferable to not assign a priority when the changeable set includes the one input terminal associated with the received request, but rather simply acknowledge completion of the one-shot conversion when the sweep is completed as illustrated in the first timing diagram of FIG. 2.

According to another exemplary embodiment, when the changeable set of the input terminals does not include the one of the changeable and fixed input terminals associated with the received request, the system can include logic configured to determine a priority between the converting of the plurality of analog signals and the received request. For example, in the third and fourth timing diagrams shown in FIG. 2, the changeable set AN2–AN4 of the input terminals 102 associated with the STR does not include the one input terminal AN1 associated with the OTR.

When the received request has the priority, the system can include logic configured to halt the converting of the plurality of analog signals, logic configured to convert the analog signal presented at the one of the changeable and fixed input terminals associated with the received request, and logic configured to resume the converting of the plurality of analog signals. For example, in the third timing diagram shown in FIG. 2, the OTR for AN1 occurs while the analog signals presented at the changeable set AN2–AN4 of the input terminals are being converted. Because in the example the OTR has priority over the current sweep, the sweep can be halted after completing the current conversion of the analog signal presented at AN2, and the analog signal presented at the one input terminal AN1 associated with the OTR can be converted. Successful completion of the one-shot conversion of AN1 can be acknowledged ACK_O, and the sweep can then be resumed. When the conversion of the analog signal presented at the last input terminal AN4 in the changeable set is complete, successful completion of the sweep can be acknowledged ACK_S.

When the converting of the plurality of analog signals has the priority, the system can include logic configured to deny the received request. For example, in the fourth timing diagram shown in FIG. 2, the OTR for AN1 again occurs while the analog signals presented at the changeable set AN2–AN4 of the input terminals are being converted. Because in the example the current sweep has the priority, a denial of the one-shot request DNY_O can be issued, arid the sweep can continue uninterrupted. When the conversion of the analog signal presented at the last input terminal AN4 in the changeable set is complete, successful completion of the sweep can be acknowledged ACK_S.

According to another exemplary embodiment, a system for analog-to-digital signal conversion includes a plurality of input terminals such as the input terminals 102 shown in FIG. 1. The system includes logic configured to associate a first request with a first conversion mode and a second request with a second conversion mode. The system also includes logic configured to receive the first and second requests. For example, the input selection logic 106 and/or the A/D converter 108 can receive trigger signals (or requests) generated by the trigger selection logic 104 over the trigger signal lines 110, 114, 116.

The system also includes a converter coupled to the input terminals and the logic configured to associate and receive, such as the A/D converter 108. The converter is configured to convert an analog signal presented at one of the input terminals into a digital value in one of the first conversion mode when a first request is received. The first conversion mode can correspond to a sweep conversion of an analog signal presented at each input terminal of a set of the input terminals in succession.

Figure 5:
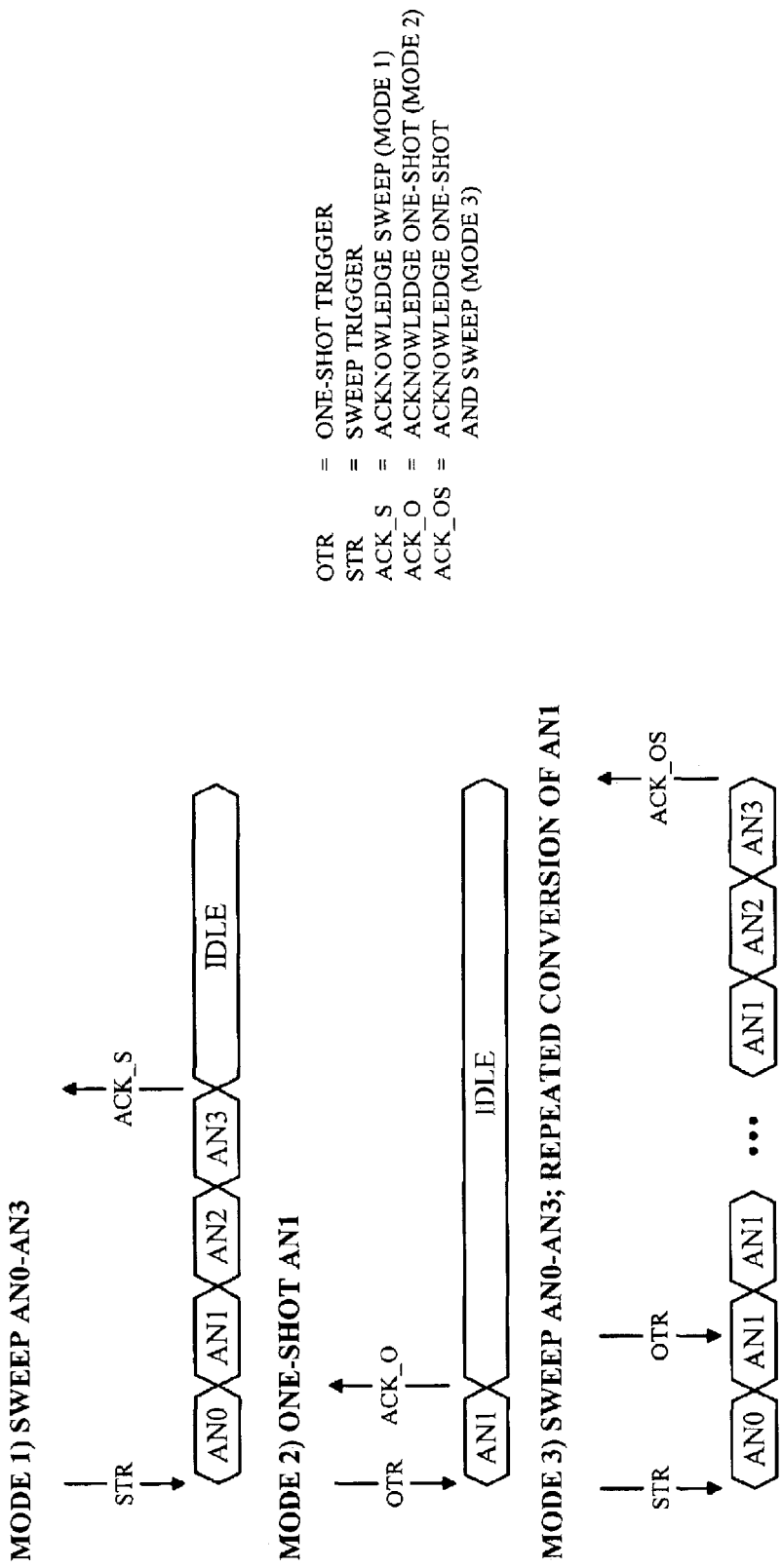
FIG. 5 illustrates exemplary timing diagrams associated with the conversion of signals according to another exemplary embodiment.

For example, FIG. 5 shows three timing diagrams, the first of which depicts a sweep mode conversion of the analog signals presented on the input terminals AN0–AN3. A sweep trigger signal (STR) corresponding to the first request can be received by the input selection logic 106 and/or the A/D converter 108 over the sweep trigger line 110. Each of the analog signals, or portions (or samples) thereof, presented at the input terminals AN0–AN3 are converted by the A/D converter 108 into respective digital values DO in succession. An acknowledgment ACK_S of the successful completion of the sweep can be issued when the sweep has completed.

The converter is also configured to convert an analog signal in the second conversion mode when a second request is received and the converter is idle. As used here, "idle" means that the converter is not presently converting analog signals presented at input terminals corresponding to previously received requests or triggers. The second conversion mode can correspond to a single conversion (or one-shot conversion) of an analog signal presented at one of the input terminals.

For example, the second timing diagram of FIG. 5 depicts a one-shot mode conversion of the analog signal presented on the input terminal AN1, A one-shot trigger signal (OTR) corresponding to the second request can be received by the input selection logic 106 and/or the A/D converter 108 over the one-shot trigger line 114. The analog signal, or a portion (or sample) thereof, presented at the input terminals AN1 is converted by the A/D converter 108 into a digital value D0. An acknowledgment ACK_O of the successful completion of the one-shot can be issued when the conversion has completed.

The converter is also configured to convert an analog signal in a third conversion mode when a second request is received while the converter is converting an analog signal in the first conversion mode. The third conversion mode can corresponds to a repeated conversion of an analog signal (or a repeated conversion) presented at one of the input terminals. Accordingly, the conversion mode can be changed depending on the context in which the second request is received.

For example, the third timing diagram of FIG. 5 depicts a one-shot trigger signal (OTR) corresponding to the second request arriving after a sweep mode conversion of the analog signals presented on the input terminals AN0–AN3 has begun. Rather than performing a one-shot mode conversion of the analog signal presented on the input terminal AN1, as shown in the second timing diagram, a repeated conversion of the analog signal presented on the input terminal AN1 can be performed until some event occurs. The event could be the result of a timeout occurring, or perhaps the repeatedly converted digital value D0 exceeding a predetermined threshold. When the event occurs, the sweep can continue to completion and an acknowledgement ACK_OS can be issued to signify the successful completion of the third mode of conversion.

It will be understood that the conversion modes described above are exemplary, and that other conversion modes can be associated with first and second requests.

Figure 3:
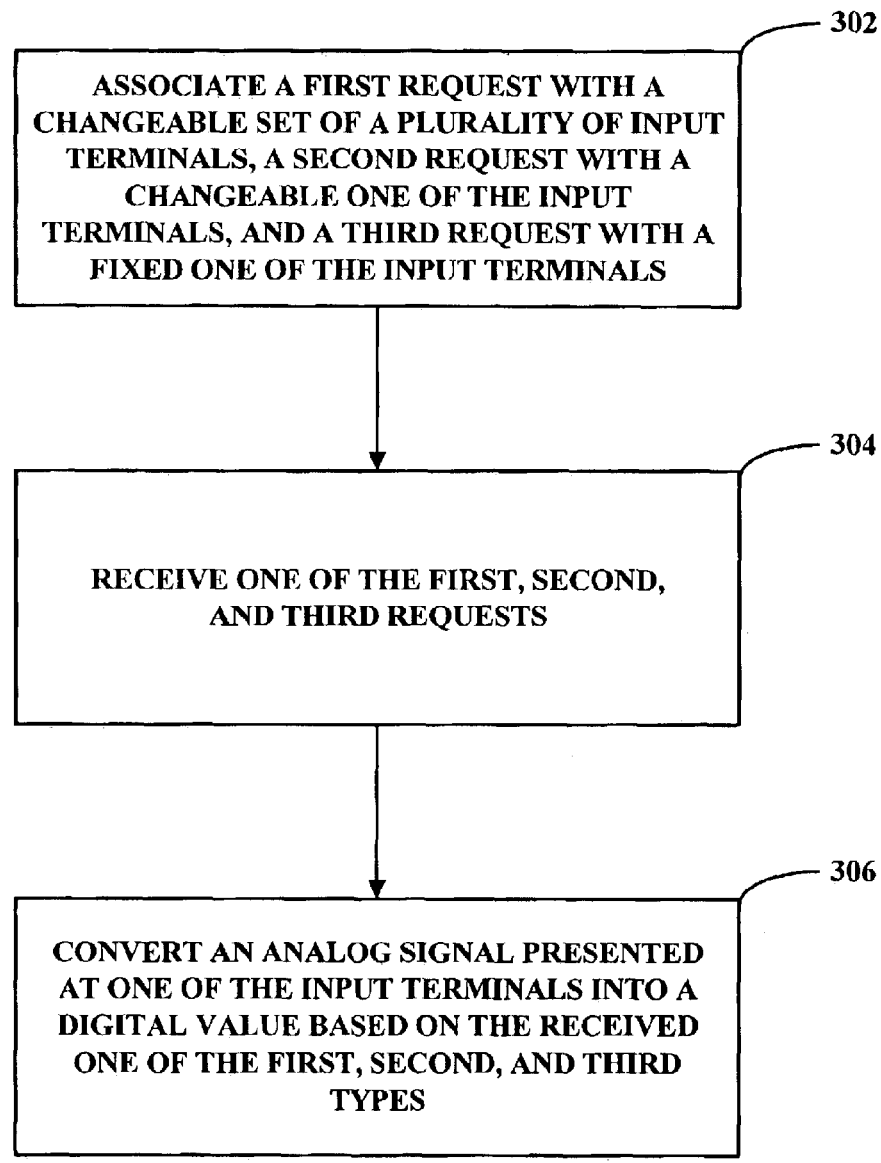
FIG. 3. is a flowchart illustrating a method for analog-to-digital signal conversion according to an exemplary embodiment.

FIG. 3 is a flowchart illustrating a method for analog-to-digital signal conversion according to an exemplary embodiment. The method can be carried out using the exemplary system depicted in FIG. 1, portions of which are referenced below for illustration purposes.

In block 302, a first request is associated with a changeable set of a plurality of input terminals. The first request can be a sweep trigger generated using the trigger selection logic 104 shown in FIG. 1. A changeable set, e.g., AN0–AN3, of the input terminals 102 can be associated with the first request using the input selection logic 106 shown in FIG. 1.

A second request is associated with a changeable one of the input terminals. The second request can be a one-shot trigger, and the changeable one can be any one the input terminals 102. Again the trigger selection 104 and input selection 106 logic can be used to configure the second request and to associate it with the changeable one of the input terminals.

A third request is associated with a fixed one of the input terminals. The third request can also be a one-shot trigger, but unlike the second request, the one input terminal associated with the third request is fixed. The terms "changeable" and "fixed" as used here are consistent with their meanings described in conjunction with the exemplary system shown in FIG. 1.

In block 304, one of the first, second, and third requests is received. The request can be received by the input selection logic 106 and/or the A/D converter 108 shown in FIG. 1. The request can be received over separate signal lines 110, 114, 116 corresponding the respective first, second, and third requests.

In block 306, an analog signal presented at one of the input terminals is converted into a digital value based on the received one of the first, second, and third requests. For example, the A/D converter 108 shown in FIG. 1 can be used to convert one of the analog signals, or a portion (or sample) thereof, into the digital value D0 in response to receiving one of the first, second, or third requests.

Figure 4:
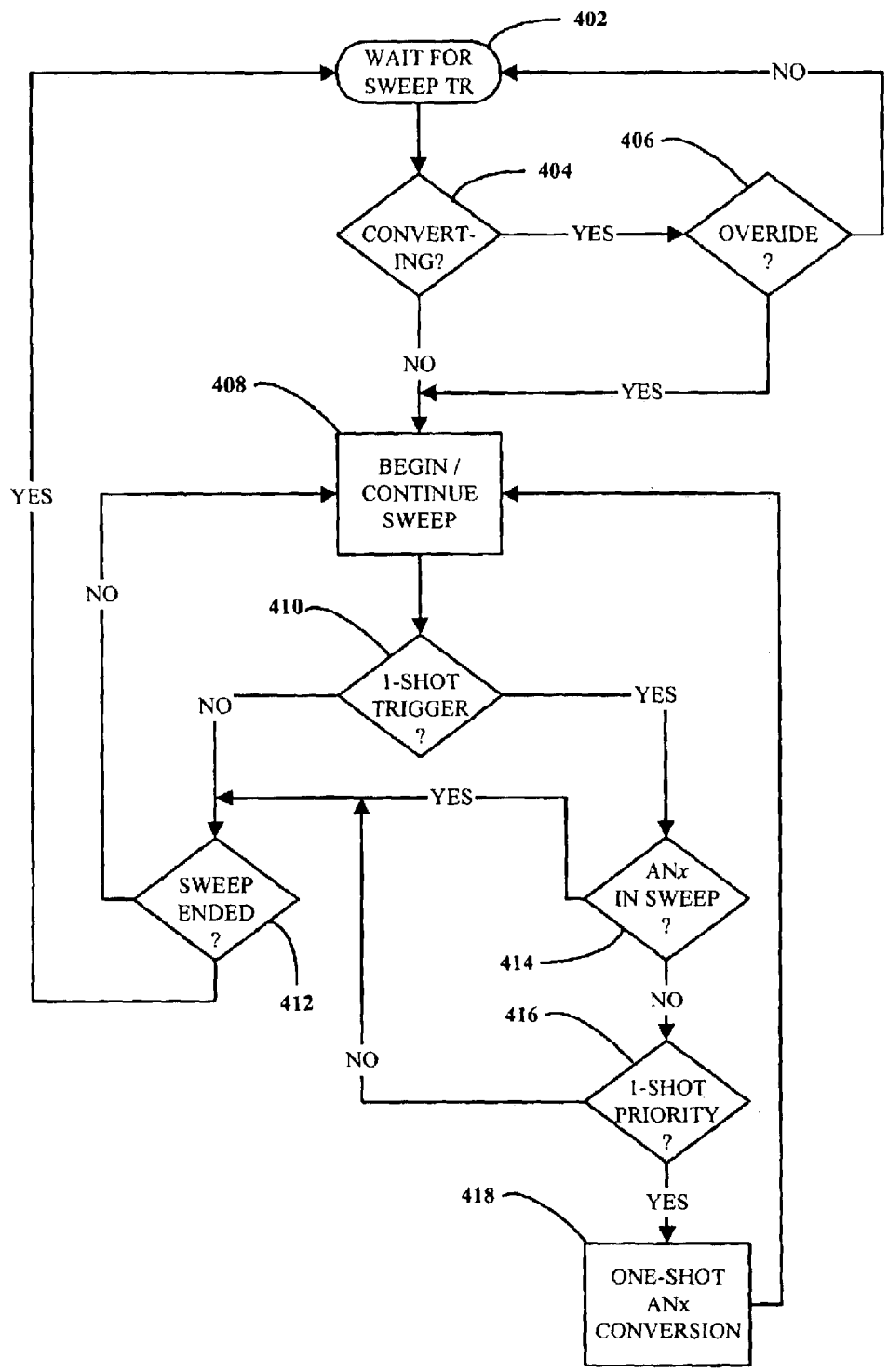
FIG. 4 is a flowchart illustrating a method for analog-to-digital signal conversion according to another exemplary embodiment.

FIG. 4 is a flowchart illustrating exemplary methods for analog-to-digital signal conversion. The occurrence of a sweep trigger in block 402 can begin a sweep of a changeable set of input terminals in block 408. If in block 404 it is determined that a conversion is already in progress when the sweep trigger occurs, the sweep can occur in block 408 if an override flag is set. If the override flag is not set, then the sweep trigger can be ignored and the current conversion allowed to complete.

After the sweep of the changeable set of input terminals has begun in block 408, a determination can be made in block 410 whether a one-shot trigger has occurred. The one-shot trigger can be one the second and third requests, and can be associated with a changeable -or fixed one of the input terminals, respectively. When a one-shot trigger does not occur, a determination can be made in block 412 whether the sweep has completed, and the method can proceed to either block 402 or 408, accordingly.

According to an exemplary embodiment, when the request is one of the second and third requests and is received while converting a plurality of analog signals presented at the changeable set of the input terminals, the method can include determining whether the changeable set of the input terminals includes the one of the changeable and fixed input terminals associated with the received request.

For example, in FIG. 4, when it is determined in block 410 that a one-shot has occurred, a determination can be made in block 414 whether the changeable set of input terminals associated with the sweep request includes the one input terminal associated with one-shot request. When the changeable set of the input terminals includes the-one of the changeable and fixed input terminals associated with the received request, a determination can be made in block 412 whether the sweep has completed, and the method can proceed to either block 402 or 408, accordingly. This operation is described in detail above in conjunction with the first timing diagram shown in FIG. 2. The method can also include acknowledging a completion of the received request when the converting of the plurality of analog signals is complete.

When the changeable set of the input terminals includes the one of the changeable and fixed input terminals associated with the received request, the method can include determining a priority between the converting of the plurality of analog signals and the received request. When the converting of the plurality of analog signals has the priority, the method can include acknowledging a completion of the received request when the converting of the plurality of analog signals is complete. This operation is described in detail above in conjunction with the first timing diagram shown in FIG. 2.

When instead the received request has the priority, the method can include halting the converting of the plurality of analog signals, converting the analog signal presented at the one of the changeable and fixed input terminals associated with the received request, and resuming the converting of the plurality of analog signals. This operation is described in detail above in conjunction with the second timing diagram shown in FIG. 2.

According to an exemplary embodiment, when the changeable set of the input terminals does not include the one of the changeable and fixed input terminals associated with the received request, the method can include determining a priority between the converting of the plurality of analog signals and the received request. For example, in FIG. 4 when it is determined in block 414 that the changeable set of the input terminals does not include the one of the changeable and fixed input terminals associated with the received request, a priority can be determined in block 416.

When the received request has the priority, the method can include halting the converting of the plurality of analog signals, converting the analog signal presented at the one of the changeable and fixed input terminals associated with the received request, and resuming the converting of the plurality of analog signals. For example, in FIG. 4 when it is determined in block 416 that the one-shot trigger has the priority, the current sweep can be halted and the analog signal presented at the input terminal associated with the one-shot can be converted in block 418. When the conversion is complete, the sweep can be continued in block 408. This operation is described in detail above in conjunction with the third timing diagram shown in FIG. 2.

When instead it is determined in block 416 that the current sweep has the priority, the one-shot trigger can be ignored and the method can proceed to block 412, where it can be determined whether the sweep has completed. The method can then proceed to either block 402 or 408, accordingly. The method can also include denying the received request to indicate that the request onesshot was not completed. This operation is described in detail above in conjunction with the fourth timing diagram shown in FIG. 2.

The instructions of a computer program as illustrated in FIGS. 3 and 4 for analog-to-digital signal conversion can be embodied in any computer readable medium for use by or in connection with an instruction execution system, apparatus, or device, such as a computer based system, processor containing system, or other system that can fetch the instructions from the instruction execution system, apparatus, or device and execute the instructions.

As used here, a "computer readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non exhaustive list) of the computer readable medium can include the following: an electrical connection having one or more wires, a portable computer diskette, a random access memory (RAM), a read only memory (ROM), an erasable programmable read only memory (EPROM or Flash memory), an optical fiber, and a portable compact disc read only memory (CDRQM).

It will be appreciated by those of ordinary skill in the art that the concepts and techniques described here can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A system for analog-to-digital signal conversion, the system comprising:

a plurality of input terminals;

logic configured to associate a first request with a changeable set of the input terminals, a second request with a changeable one of the input terminals, and a third request with a fixed one of the input terminals;

logic configured to receive one of the first, second, and third requests; and a converter coupled to the input terminals and the logic configured to associate and receive, the converter configured to convert an analog signal presented at one of the input terminals into a digital value based on a received one of the first, second, and third requests.

2. The system of claim 1, wherein when one of the second and third requests is received while converting a plurality of analog signals presented at the changeable set of the input terminals, the system comprises:

logic configured to determine whether the changeable set of the input terminals includes the one of the changeable and fixed input terminals associated with the received request.

3. The system of claim 2, wherein when the changeable set of the input terminals includes the one of the changeable and fixed input terminals associated with the received request, the system comprises:

logic configured to acknowledge a completion of the received request when the converting of the plurality of analog signals is complete.

4. The system of claim 2, wherein when the changeable set of the input terminals includes the one of the changeable and fixed input terminals associated with the received request, the system comprises:

logic configured to determine a priority between the converting of the plurality of analog signals and the received request.

5. The system of claim 4, wherein when the converting of the plurality of analog signals has the priority, the system comprises:

logic configured to acknowledge a completion of the received request when the converting of the plurality of analog signals is complete.

6. The system of claim 4, wherein when the received request has the priority, the system comprises:

logic configured to halt the converting of the plurality of analog signals;

logic configured to convert the analog signal presented at the one of the changeable and fixed input terminals associated with the received request; and logic configured to resume the converting of the plurality of analog signals.

7. The system of claim 2, wherein when the chargeable set of the input terminals does not include the one of the changeable and fixed input terminals associated with the received request, the system comprises:

logic configured to determine a priority between the converting of the plurality of analog signals and the received request.

8. The system of claim 7, wherein when the converting of the plurality of analog signals has the priority, the system comprises:

logic configured to deny the received request.

9. The system of claim 7, wherein when the received request has the priority, the system comprises:

logic configured to halt the converting of the plurality of analog signals;

logic configured to convert the analog signal presented at the one of the changeable and fixed input terminals associated with the received request; and logic configured to resume the converting of the plurality of analog signals.

10. A method for analog-to-digital signal conversion, the method comprising:

associating a first request with a changeable set of a plurality of input terminals, a second request with a changeable one of the input terminals, and a third request with a fixed one of the input terminals;

receiving one of the first, second, and third requests; and converting an analog signal presented at one of the input terminals into a digital value based on the received one of the first, second, and third requests.

11. The method of claim 10, wherein when one of the second and third requests is received while converting a plurality of analog signals presented at the changeable set of the input terminals, the method comprises:

determining whether the changeable set of the input terminals includes the one of the changeable and fixed input terminals associated with the received request.

12. The method of claim 11, wherein when the changeable set of the input terminals includes the one of the changeable and fixed input terminals associated with the received request, the method comprises:

acknowledging a completion of the received request when the converting of the plurality of analog signals is complete.

13. The method of claim 11, wherein when the changeable set of the input terminals includes the one of the changeable and fixed input terminals associated with the received request, the method comprises:

determining a priority between the converting of the plurality of analog signals and the received request.

14. The method of claim 13, wherein when the converting of the plurality of analog signals has the priority, the method comprises:

acknowledging a completion of the received request when the converting of the plurality of analog signals is complete.

15. The method of claim 13, wherein when the received request has the priority, the method comprises:

halting the converting of the plurality of analog signals;

converting the analog signal presented at the one of the changeable and fixed input terminals associated with the received request; and resuming the converting of the plurality of analog signals.

16. The method of claim 11, wherein when the changeable set of the input terminals does not include the one of the changeable and fixed input terminals associated with the received request, the method comprises:

determining a priority between the converting of the plurality of analog signals and the received request.

17. The method of claim 16, wherein when the converting of the plurality of analog signals has the priority, the method comprises:

denying the received request.

18. The method of claim 16, wherein when the received request has the priority, the method comprises:

halting the converting of the plurality of analog signals;

converting the analog signal presented at the one of the changeable and fixed input terminals associated with the received request; and resuming the converting of the plurality of analog signals.

19. A computer readable medium containing a computer program for analog-to-digital signal conversion, wherein the computer program comprises executable instructions for:

associating a first request with a changeable set of a plurality of input terminals, a second request with a changeable one of the input terminals, and a third request with a fixed one of the input terminals;

receiving one of the first, second, and third requests; and converting an analog signal presented at one of the input terminals into a digital value based on the received one of the first, second, and third requests.

20. The computer readable medium of claim 19, wherein when one of the second and third requests is received while converting a plurality of analog signals presented at the changeable set of the input terminals, the computer program comprises executable instructions for:

determining whether the changeable set of the input terminals includes the one of the changeable and fixed input terminals associated with the received request.

21. A system for analog-to-digital signal conversion, the system comprising:

a plurality of input terminals;

logic configured to associate a first request with a first conversion mode and a second request with a second conversion mode;

logic configured to receive the first and second requests; and a converter coupled to the input terminals and the logic configured to associate and receive, the converter configured to convert an analog signal presented at one of the input terminals into a digital value in one of the first conversion mode when a first request is received, the second conversion mode when a second request is received and the converter is idle, and a third conversion mode when a second request is received while the converter is converting an analog signal in the first conversion mode.

22. The system of claim 21, wherein the first conversion mode corresponds to a sweep conversion of an analog signal presented at each input terminal of a set of the input terminals in succession.

23. The system of claim 21, wherein the second conversion mode corresponds to a single conversion of an analog signal presented at one of the input terminals.

24. The system of claim 21, wherein the third conversion mode corresponds to a repeated conversion of an analog signal presented at one of the input terminals.

* * * * *